(12) United States Patent
Kim et al.

(10) Patent No.: US 8,542,223 B2
(45) Date of Patent: Sep. 24, 2013

(54) DISPLAY DEVICE HAVING REDUCED REFLECTION OF VISIBLE LIGHT

(75) Inventors: Sang-Jae Kim, Seongnam-si (KR); Seungbeom Park, Seoul (KR); Hee Wook Do, Cheonan-si (KR); Kwang-Hyun Kim, Gunpo-si (KR); Daewon Kim, Dongducheon-si (KR); Gwan Young Na, Osan-si (KR)

(73) Assignee: Samsung Display Co., Ltd. (KR)

( * ) Notice: Subject to any disclaimer, the term of this patent is extended or adjusted under 35 U.S.C. 154(b) by 161 days.

(21) Appl. No.: 13/290,620

(22) Filed: Nov. 7, 2011

(65) Prior Publication Data

US 2012/0249504 A1    Oct. 4, 2012

(30) Foreign Application Priority Data

Mar. 28, 2011    (KR) .......................... 10-2011-0027726

(51) Int. Cl.
*G09G 5/00*    (2006.01)

(52) U.S. Cl.
USPC ........................................................ 345/207

(58) Field of Classification Search
USPC ............ 345/207, 8, 156, 166, 173, 175, 176, 345/204, 206, 690, 698
See application file for complete search history.

(56) References Cited

U.S. PATENT DOCUMENTS

| 7,850,801 B2 * | 12/2010 | Kobayashi et al. ............. 156/64 |
| 8,269,754 B2 * | 9/2012 | Nagata .......................... 345/207 |
| 2006/0066788 A1 * | 3/2006 | Utsumi et al. ................ 349/120 |
| 2011/0221659 A1 * | 9/2011 | King et al. ........................ 345/8 |
| 2011/0221793 A1 * | 9/2011 | King et al. .................... 345/690 |
| 2011/0222745 A1 * | 9/2011 | Osterhout et al. ............ 382/118 |
| 2011/0227820 A1 * | 9/2011 | Haddick et al. ............... 345/156 |
| 2011/0231757 A1 * | 9/2011 | Haddick et al. ............... 715/702 |
| 2012/0062445 A1 * | 3/2012 | Haddick et al. ................... 345/8 |
| 2012/0075168 A1 * | 3/2012 | Osterhout et al. ................ 345/8 |

FOREIGN PATENT DOCUMENTS

| JP | 2001-007343 A | 1/2001 |
| JP | 2009-075385 A | 4/2009 |
| JP | 2009-244638 A | 10/2009 |

* cited by examiner

*Primary Examiner* — Fred Tzeng
(74) *Attorney, Agent, or Firm* — Innovation Counsel LLP

(57) ABSTRACT

A display device includes a display panel, a polarization film, and a wave plate. Below the wave plate and the polarization film there is provided a plurality of optical sensors disposed within the display panel. The display panel includes first and second substrates facing each other and a plurality of pixels configured to display an image. The optical sensors are configured to sense light in one or more predetermined light bands. The wave plate is configured to rotate polarization of first light that has passed upwardly through the polarization film such that the combination of upward and downward (reflected) passage of the light is rotated by about 90 degrees. The so-rotated light is blocked from passing down through the polarization film; advantageously, the so-rotated light is prevented from interfering with the optical sensors.

20 Claims, 11 Drawing Sheets

DISPLAY DEVICE HAVING REDUCED REFLECTION OF VISIBLE LIGHT

CROSS-REFERENCE TO RELATED APPLICATIONS

This U.S. non-provisional patent application claims priority under 35 U.S.C. §119 of Korean Patent Application No. 10-2011-0027726, filed on Mar. 28, 2011, the entire contents of which application are hereby incorporated by reference.

BACKGROUND

The present disclosure relates to a display device, and more particularly, to a display device with enhanced ability to sense changes in externally reflected light.

Generally, touch-detecting display panels allow commands displayed on a screen portion of a corresponding display device to be selected by a person's hand or other object touching or otherwise coming in close proximity to a corresponding screen region. Display devices with touch-detecting display panels are recently being more widely used because the display devices do not require separate input devices such as keyboards, mouses, and scanners and thus they can service needs of the mobile computing market such those of tablet computers and smartphones.

Traditionally, the touch sensor used in a touch-detecting display panel may be disposed at an upper major surface the display panel. Alternatively the touch sensor used in a touch-detecting display panel may be disposed deeper inside the display panel. The sensor disposed at the upper side of the display panel or inside the display panel senses an intended touch signal by sensing a change in received visible light and/or a change in received infrared (IR) light where the received visible and/or IR light might originally be supplied from a backlight unit of the display panel and/or from outside of the display device.

However, there are some infrared sensors used for touch-detecting display panel which sense light not only in the infrared (IR) range but also in other ranges. In such a case, the sensor may incorrectly interpret a change of visible light intensity as being a change in reflected IR intensity.

SUMMARY

The present disclosure of invention provides a display device with enhanced ability to correctly sense change of externally reflected light in different bands.

Embodiments in accordance with the present disclosure of inventive concepts provide a display device including: a display panel including first and second substrates facing each other and a having plurality of pixels, and being structured for displaying a sometimes changing image in the visible light band; a plurality of optical sensors included in the display panel to sense lights of different wavelengths; a polarization film provided on the first substrate or the second substrate and structured to transmit light polarized in a first direction and to substantially absorb light polarized in a second direction which is substantially vertical to the first direction; and a quarter wave plate included to face the display panel with the polarization film disposed therebetween, wherein the wave plate is structured to change a polarization direction of light of a predetermined wavelength (e.g., visible band light) which has passed through the quarter wave plate twice (once when outgoing and a second time when reflected back), by about 90 degrees so the twice passed light is then blocked by the polarization film.

BRIEF DESCRIPTION OF THE DRAWINGS

The accompanying drawings are included to provide a further understanding of the here-disclosed concepts, and are incorporated in and constitute a part of this specification. The drawings illustrate exemplary embodiments and, together with the description, serve to explain principles of the here-disclosed concepts. In the drawings.

DETAILED DESCRIPTION

Exemplary embodiments in accordance with the present disclosure will be described below in more detail with reference to the accompanying drawings. The inventive concepts taught herein may, however, be embodied in different forms and should not be construed as limited to the embodiments set forth herein. Rather, these embodiments are provided so that this disclosure will be thorough and complete, and will fully convey the scope of here-taught inventive concepts to those skilled in the pertinent art.

Figure 1:
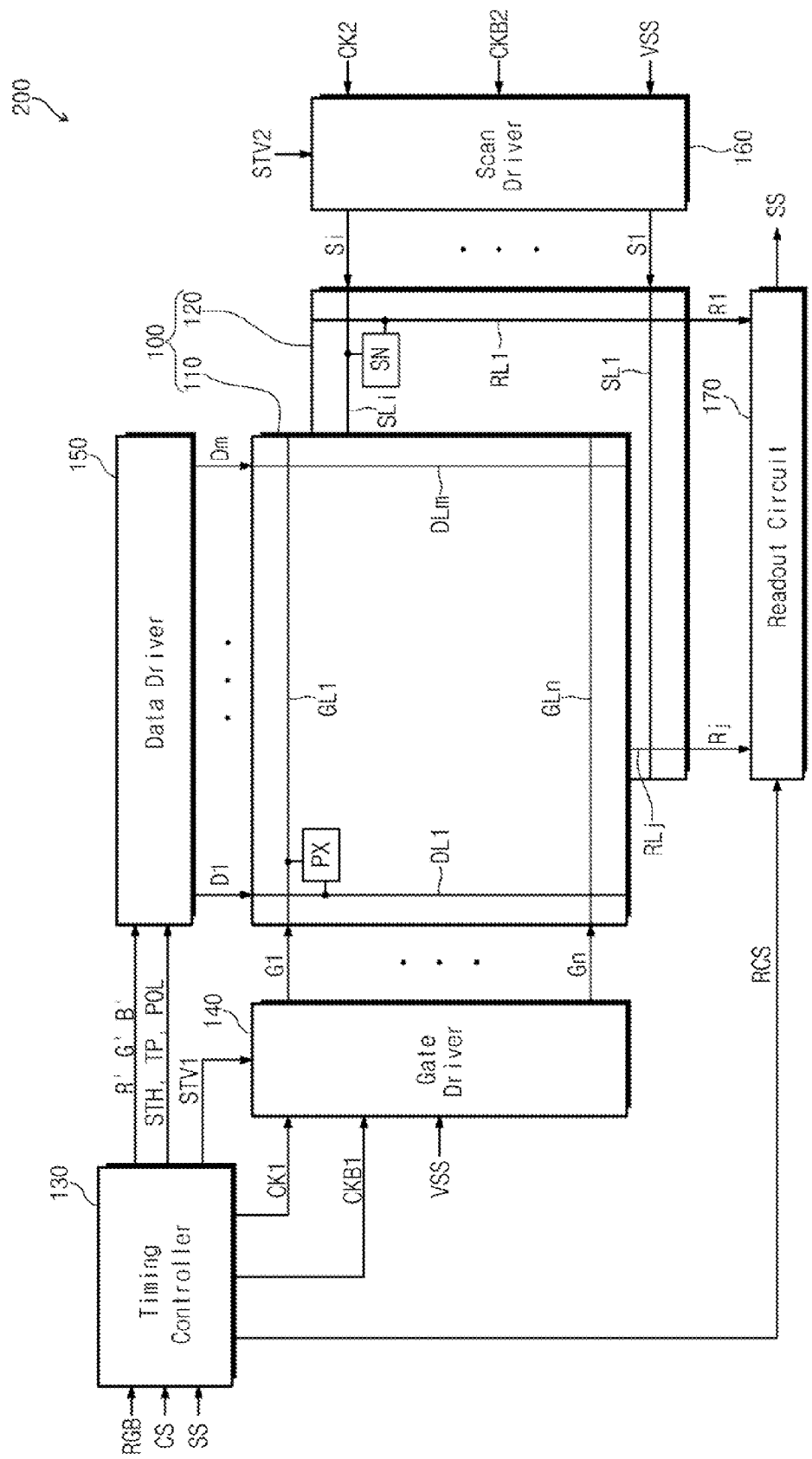
FIG. 1 is a block diagram illustrating a display device according to an embodiment of the present disclosure.

FIG. 1 is a block diagram illustrating a display device according to a first embodiment.

Referring to FIG. 1, a display device 200 includes a display panel 100, a timing controller 130, a gate driver 140, a data driver 150, a scan driver 160, and a readout circuit 170.

The timing controller 130 receives a plurality of image signals RGB and control signals CS from a device external to the display device 200. The timing controller 130 converts data formats of the received image signals RGB in accordance with an interface specification, and supplies the converted image signals R'G'B' to the data driver 150. Also, the timing controller 130 supplies a plurality of data control signals (for example, an output start signal TP, a horizontal start signal STH, and a polarity inversion control signal POL) to the data driver 150, and supplies a plurality of gate control signals (for example, a first start signal STV1, a first clock signal CK1, and a second clock signal CKB1) to the gate driver 140.

Moreover, the timing controller 130 supplies a plurality of sensing scan control signals (for example, a second start signal STV2, a third clock signals CK2, and a fourth clock signal CKB2) to the sensors scan driver 160. The scan driver 160 receives the scan control signals STV2, CK2 and CKB2 to sequentially output a plurality of sensor row scan signals S1 to Si. The scan control signals STV2, CK2 and CKB2 may be signals synchronized with the gate control signals STV1, CK1 and CKB1, respectively.

The gate driver 140 sequentially outputs a plurality of row activating gate signals G1 to Gn in response to the gate control signals STV1, CK1 and CKB1 supplied from the timing controller 130.

The data driver 150 converts the converted image signals R'G'B' into analog data voltages D1 to Dm and outputs the data voltages D1 to Dm to corresponding data lines DL1-DLm on display panel 100, in response to the data control signals TP, STH and POL supplied from the timing controller 130.

The scan driver 160 receives the scan control signals STV2, CK2 and CKB2 from the timing controller 130 and responsively sequentially outputs its corresponding plurality of scan signals, S1 to Si.

The display panel 100 includes a first substrate 110, a second substrate 120 spaced apart from and facing the first substrate 110, and a liquid crystal layer (not shown) disposed between the first and second substrates 110 and 120. Despite what is schematically illustrated in FIG. 1, the second substrate 120 is typically disposed above the first substrate 110 (see for example FIG. 4). A plurality of pixel units PX may be disposed on the first substrate 110. A plurality of sensor units SN may be disposed on the second substrate 120.

Each of the pixel units PX has a substantially same structure, and thus only one pixel unit is illustrated as an example in FIG. 1.

A plurality of gate lines GL1 to GLn, a plurality of data lines DL1 to DLm crossing the gate lines GL1 to GLn, and also the pixel units PX are formed on the first substrate 110. Each of the pixel units PX may include at least one thin film transistor (TFT, not shown) and at least one pixel electrode (PE, not shown). A gate electrode of the thin film transistor is connected to a corresponding gate line among the gate lines GL1 to GLn, and a source electrode of the thin film transistor is connected to a corresponding data line among the data lines DL1 to DLm, and a drain electrode of the thin film transistor is connected to a corresponding pixel electrode of its respective pixel unit PX.

The gate lines GL1 to GLn are connected to the gate driver 140, and the data lines DL1 to DLm are connected to the data driver 150. The gate lines GL1 to GLn receive a plurality of gate signals G1 to Gn supplied from the gate driver 140, respectively. The data lines DL1 to DLm receive a plurality of data signals D1 to Dm supplied from the data driver 150, respectively.

As the thin film transistor of the each pixel PX is turned on at a corresponding time (e.g., a 1H row scanning period), where turn-on is in response to a turn-on gate signal (e.g., a VgON pulse) supplied over the corresponding gate line, and as a corresponding data voltage (Dj) is supplied to the corresponding data line (DLj), the data voltage is applied to the respective pixel electrode through the turned-on thin film transistor. The voltage of the pixel electrode affects the optical orientation of adjacent liquid crystal molecules and a desired image effect is thus obtained.

A so-called, reference electrode or common electrode that faces the pixel electrode with the liquid crystal layer therebetween may be formed on the second substrate 120 and an electric field may be generated between the pixel-electrode and the reference or common electrode. Since the image data signals provided by the data lines DL1-DLm may from time to time change, it is possible for visible light band signals output by the display itself to change drastically from relatively dark intensity to relatively bright intensity, thus mimicking what might be seen if a user's finger or other light reflecting object reflected light back into a touched screen region. Touch sensors of the device might incorrectly interpret a reflection of such dark-to-bright switching display output as instead indicating a touching of a screen region by an IR reflecting object.

Still referring to FIG. 1, a plurality of scan lines SL1 to SLi, a plurality of readout lines RL1 to RLj crossing the scan lines SL1 to SLi, and the sensor units SN are formed on the second substrate 120.

The scan lines SL1 to SLi are connected to the scan driver 160 and sequentially receive the scan signals 51 to Si, respectively.

Although not shown, the display device 200 may further include a backlight unit that is disposed adjacently to and beneath the display panel 100 and supplies backlighting light to the display panel 100. A backlight unit will be described below in detail with reference to FIG. 3. In one embodiment, the backlight unit provides backlighting in both the visible light band and in the IR light band.

Figure 2:
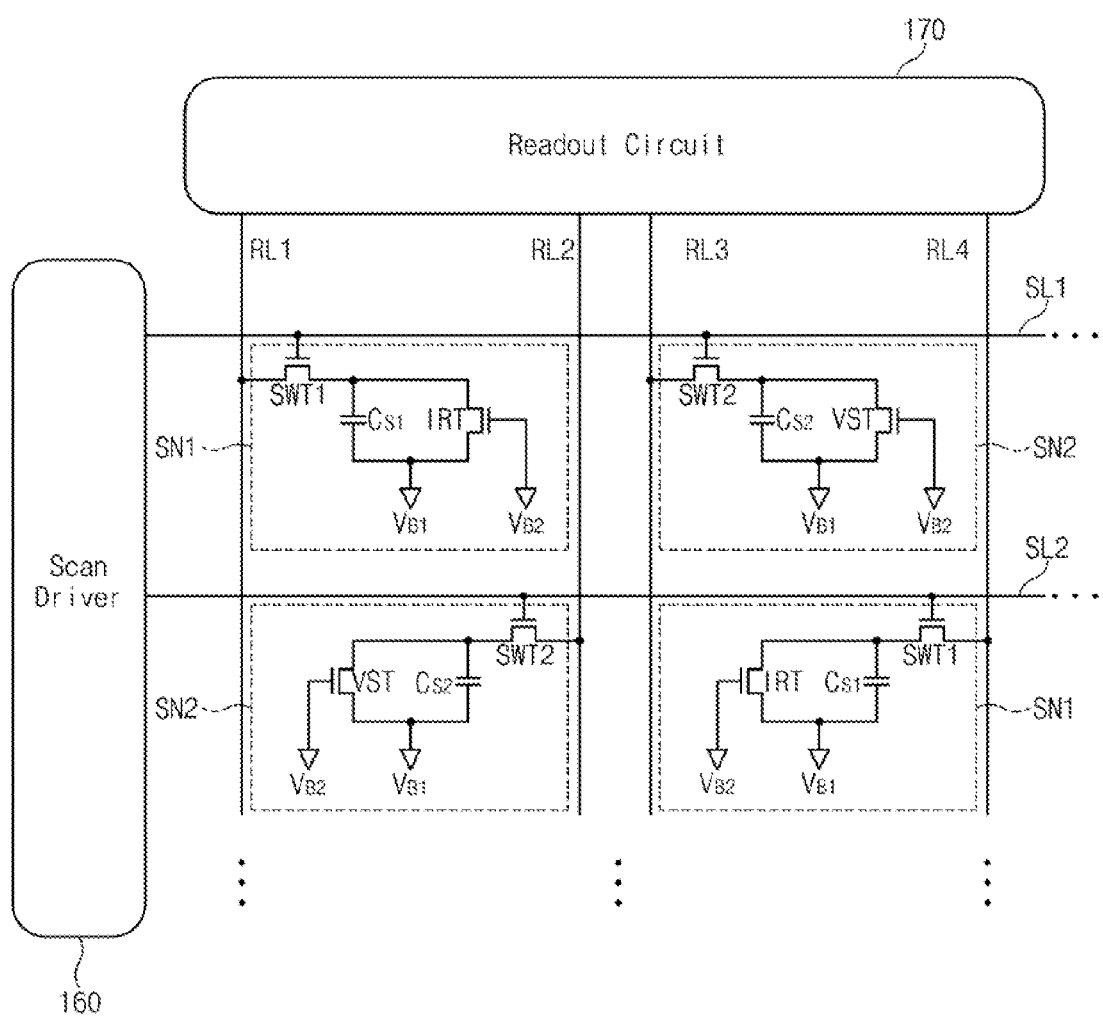
FIG. 2 is a circuit diagram illustrating sensors of FIG. 1.

FIG. 2 is a circuit diagram illustrating the sensors and sensor driving portions of FIG. 1.

For convenience, only the first and second scan lines SL1 and SL2 of the scan lines SL1 to SLi and the first to fourth readout lines RL1 to RL4 of the readout lines RL1 to RLj are illustrated in FIG. 2.

Referring to FIG. 2, the sensor units SN may be divided into two types of sensors. For example, the sensor units SN may be divided into a plurality of first-type sensors SN1 that primarily sense first light with a wavelength in an infrared range (IR), and a plurality of second-type sensors SN2 that primarily sense second light with a wavelength in a visible light range (VS).

Each of the IR-sensing first sensors SN1 includes a respective first switching transistor SWT1 (first sensor addressing element), a respective IR-sensing first sensor transistor IRT, and a respective first capacitor CS1. A gate electrode of the first switching transistor SWT1 is connected to a corresponding scan line among the scan lines SL1 to SLi, a source electrode of the first switching transistor SWT1 is connected to a corresponding readout line among the readout lines RL1 to RLj, and a drain electrode of the first switching transistor SWT1 is connected to the first capacitor CS1 and the first sensor transistor IRT as shown.

A first electrode of the first capacitor CS1 is connected to the drain electrode of the first switching transistor SWT1, and a first bias voltage VB1 is applied to a second electrode of the first capacitor CS1 as well as to a drain electrode of the first sensor transistor IRT. For example, the first bias voltage VB1 may be about −4V.

A gate electrode of the first sensor transistor IRT receives a second bias voltage VB2. A source electrode of the first sensor transistor IRT is connected to the drain electrode of the first switching transistor SWT1, and the drain electrode of the first sensor transistor IRT receives the first bias voltage VB1. The second bias voltage VB2 has a voltage level lower than that of the first bias voltage VB1. For example, the second bias voltage VB2 may be about −9V when the first bias voltage VB1 is equal to about −4V.

The first sensor transistor IRT conducts a photo current corresponding to the amount of the first light incident upon the first sensor transistor IRT from an outside source.

Each of the visible-sensing second sensors SN2 includes a respective second switching transistor SWT2 (second sensor addressing element), a respective, visible-range sensing second sensor transistor VST, and a second capacitor CS2. A gate electrode of the second switching transistor SWT2 is connected to a corresponding scan line among the scan lines SL1 to SLi, a source electrode of the second switching transistor SWT2 is connected to a corresponding readout line among the readout lines RL1 to RLj, and a drain electrode of the second switching transistor SWT2 is connected to the second capacitor CS2 and the second sensor transistor VST.

A first electrode of the second capacitor CS2 is connected to the drain electrode of the second switching transistor SWT2, and the first bias voltage VB1 is applied to a second electrode of the second capacitor CS2.

A gate electrode of the second sensor transistor VST receives the second bias voltage VB2, a source electrode of the second sensor transistor VST is connected to the drain electrode of the second switching transistor SWT2, and a drain electrode of the second sensor transistor VST receives the first bias voltage VB1.

The second sensor transistor VST conducts a respective photo current corresponding to the amount of the second light it receives from the outside.

Still referring to FIG. 2, the plurality of first and second sensors SN1 and SN2 are alternately arranged in a first direction along which the scan lines SL1 to SLi are extended, and are alternately arranged in the second direction along which the readout lines RL1 to RLj are extended.

As a more specific example, in the illustrated embodiment the first sensor SN1.(r=1, c=1) in row 1, column 1 is connected to the readout line whose number is 2c-mod(r,2) (where c is a natural column number equal to or greater than one and mod(r,2) indicates the modular arithmetic remainder of dividing the natural row number r by 2). Yet more specifically, for example, for the case of SN1 in row 1, column 1, it is connected to the first readout line RL1 of FIG. 2 because mod(r,2) equals 1. On the other hand, SN1 in row 2, column 2, it is connected to the 4th readout line RL4 of readout lines RL1 to RLj, because mod(r,2) equals 0 in that case. Similarly, for the case of the second sensors SN2, they too are connected to the readout line whose number is 2c-mod(r,2). Yet more specifically, for example, for the case of SN2 in row 1, column 2, it is connected to the third readout line RL3 of FIG. 2 because mod(r,2) equals 1 and thus 2*2−1=3. On the other hand, SN2 in row 2, column 1 is connected to the 2nd readout line RL2 of readout lines RL1 to RLj, because mod(r,2) equals 0 in that case and therefore 2*1−0=2.

When the first switching transistor SWT1 in a corresponding first sensor unit SN1 is turned on in response to an activating scan signal supplied to it via a corresponding scan line, the first sensor SN1 supplies a voltage charged in its first capacitor CS1 to a corresponding readout line through the turned-on switching transistor SWT1. Similarly, when the second switching transistor SWT2 in a corresponding second sensor unit SN2 is turned on in response to an activating scan signal supplied to it via a corresponding scan line, the second sensor SN2 supplies a voltage charged in its respective second capacitor CS2 to a corresponding readout line through the turned-on switching transistor SWT2.

The readout circuit 170 sequentially supplies a plurality of sensed voltages SS to the timing controller 130 in response to a readout control signal RCS supplied from the timing controller 130. The sensed voltages SS correspond to recharging currents provided by the readout circuit 170 via the respective readout lines RL1 to RLj for recharging the respective sensing capacitors to a predetermined reference voltage. In response to the received SS signals, the timing controller 130 may generate Two-Dimensional (2D) coordinate values information representing touched points of the screen, based on a time when the scan signal has been generated and the corresponding sensed voltage SS received from the readout circuit 170.

A method will be specifically described below where the first and second sensors SN1 and SN2 sense light incident from the outside, i.e., light that is reflected by an external object and is incident on the first and second sensors SN1 and SN2, and the readout circuit 170 measures a signal corresponding to the intensity of the sensed light.

First, the readout circuit 170 applies a certain reference voltage, for example, a voltage of 1V to the readout lines RL1 to RLj. When a gate-on signal for turning on the first and second switching transistors SWT1 and SWT2 is applied to the scan lines SL1 to SLi, the first switching transistor SWT1 outputs the voltage of 1V, received from the readout circuit 170, to thereby pre-charge the first capacitor CS1 to that reference voltage, and the second switching transistor SWT2 outputs the voltage of 1V to the second capacitor CS2 to thereby pre-charge that latter capacitor to that reference voltage. As a result, an initial reference voltage of 1V for example is present on the first electrode of the first capacitor CS1 connected to the first switching transistor SWT1 and on the first electrode of the second capacitor CS2 connected to the second switching transistor SWT2, and also the first bias voltage VB1, for example, a voltage of −4V is applied to the second electrodes of the respective first and second capacitors CS1 and CS2. Thus, an across-the-capacitor voltage of 5V is initially pre-charged into the first and second capacitors CS1 and CS2. Then SWT1 and SWT2 each turns off.

When light incident from the outside is not inputted to the first and second sensor transistors IRT and VST, the first and second sensor transistors IRT and VST are turned off, and thus the first electrodes of the respective first and second capacitors CS1 and CS2 are maintained at 1V (in other words, each capacitor retains its initial precharge voltage of 5V). Even when a next gate-on signal is applied to the scan lines SL1 to SLi and thereby the first and second switching transistors SWT1 and SWT2 are turned on, a voltage difference between the first electrodes of the respective first and second capacitors CS1 and CS2 and the readout circuit 170 does not occur, and thus essentially no recharging current flows to the readout circuit 170 through the readout lines RL1 to RLj to recharge the respective first and second capacitors CS1 and CS2 to the predetermined reference voltage.

When light incident from the outside is inputted to the first and second sensor transistors IRT and VST, the first and second sensor transistors IRT and VST may be turned on to different degrees of conductivity depending on the wavelength of the light and its intensity. Thus, a respective first electric current discharges through the turned-on first sensor transistor IRT from the first capacitor CS1, and a respective second electric current discharges through the turned-on second sensor transistor VST from the second capacitor CS2 corresponding to the intensity of respective, in-band light sensed by the respective sensor transistor (IRT and VST). Therefore, the voltages of the first electrodes of the respective first and second capacitors CS1 and CS2 may vary as a function of sensed light in the respective sensed wavelength ranges.

For example, in a case where the voltages of the first electrodes of the respective first and second capacitors CS1 and CS2 are shifted from the initial +1V reference level down to +0.5V, if a next gate-on signal is applied to the scan lines SL1 to SLi and thereby the first and second switching transistors SWT1 and SWT2 are turned on, a voltage difference of 0.5V will occur between the first electrodes of the respective first and second capacitors CS1 and CS2 and the reference voltage supplied by the readout circuit 170, and thus an electric current for recharging to the +1V reference level will flow through the readout lines RL1 to RLj. The readout circuit 170 may include a current versus time integrator (not shown) whose output substrate indicates the total amount of electric charge used to replenish each capacitor and this indirectly measures the intensity of light incident on the first and second sensors SN1 and SN2 with a voltage corresponding to the charged amount measured by the integrator circuit.

As the intensity of light inputted to the first and second sensor transistors IRT and VST increases, the voltages of the first electrodes of the respective first and second capacitors CS1 and CS2 vary more largely, a voltage difference between the first electrodes of the respective first and second capacitors CS1 and CS2 and the readout circuit 170 increases further, and thus a higher current flows through the readout lines RL1 to RLj. Therefore, the readout circuit 170 may measure different levels of replenishment currents according to the intensity of light inputted to the first and second sensor transistors IRT and VST in each replenishment cycle.

In other words, the readout circuit 170 computes an amount of replenishment electric charge needed for replenishing each sensor capacitor by means of the integrator circuit (not shown) which integrates over the replenishment period the corresponding one of sensing currents R1 to Rj respectively conveyed through the readout lines RL1 to RLj. Subsequently, the readout circuit 170 sequentially supplies as a serial reporting signal, the voltages SS, corresponding to the charged amounts measured by the integrator, to the timing controller 130.

Figure 3:
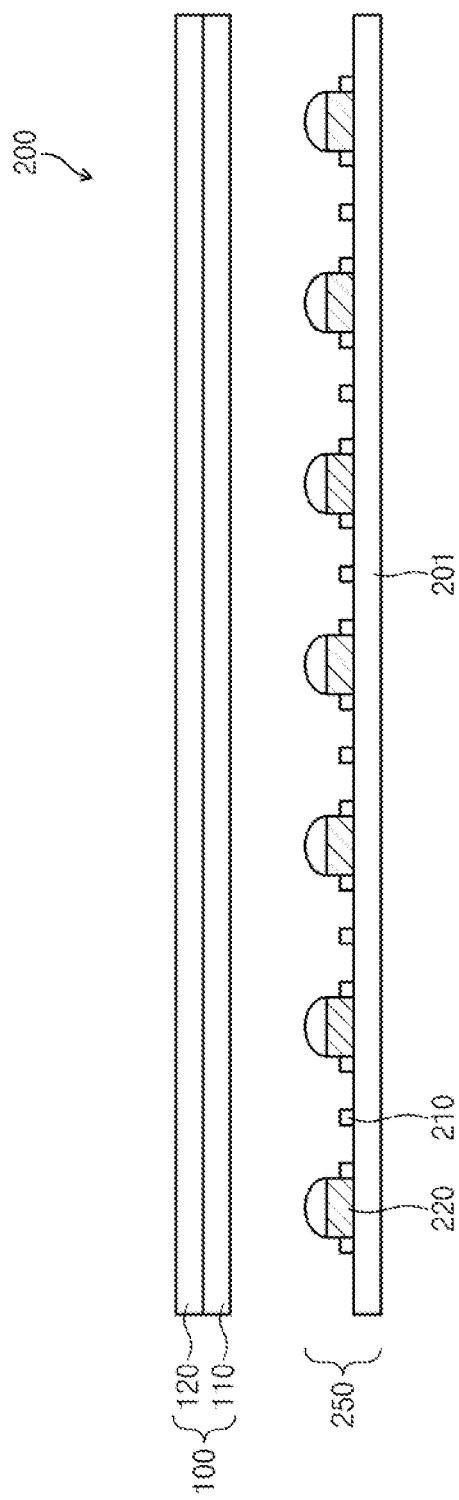
FIG. 3 is a sectional view illustrating the display device of FIG. 1.

FIG. 3 is a sectional view illustrating the display device of FIG. 1.

Referring to FIG. 3, the display device 200 includes the display panel 100 that is structured for displaying an image, and a backlight unit 250 disposed under the display panel 100 for providing the display panel 100 with backlighting.

The backlight unit 250 includes a circuit board 201 disposed under the display panel 100, a plurality of first light sources 210 mounted on the circuit board 201 to output first light with one or more wavelengths in an infrared range (IR band), and a plurality of second light sources 220 mounted on the circuit board 201 to output second light with one or more wavelengths in a visible light range (visible band).

In one embodiment, the first and second light sources 210 and 220 are alternately disposed as elongated lamps or checkerboard style disposed point or area sources. Specifically, as illustrated in FIG. 3, one or more second light sources 220 may be disposed between two adjacent first light sources 210. Also, each of the first and second light sources 210 and 220 may be configured with a Light Emitting Diode (LED).

The first light outputted from the first light sources 210 is inputted to and passes through the display panel 100. The first light passing through the display panel 100 is not discerned by a user's eyes, and thus does not affect the discerning by the user of an image displayed on the display panel 100.

As the first light outputted from the first light sources 210 passes through the display panel 100, it may be partially reflected by a plurality of layers disposed within the display panel 100, and only a portion of the first light may pass through the display panel 100 for subsequent reflection by a user's finger or other screen-touching object. More specifically, although the first light passing through the display panel 100 is normally irradiated to the outside (for example as timed pulses), when an IR-reflecting object (for example, a user's finger) comes into sufficient proximity with the upper surface of the display panel 100, the first light may be reflected by the finger or other such object. Therefore, the reflected first light may be again inputted to the display panel 100 and sensed through use of the first-type sensor transistor, IRT.

Figure 4:
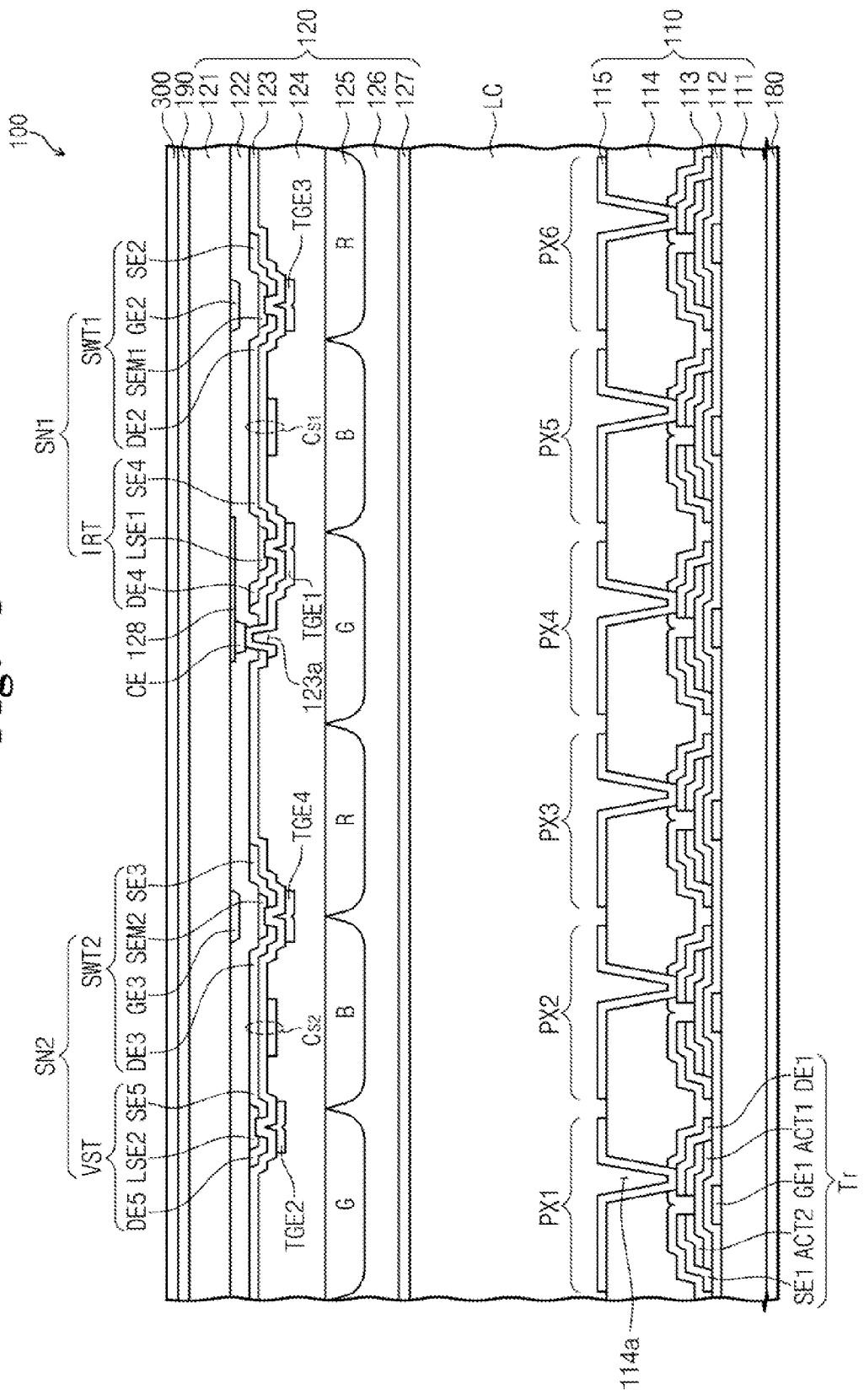
FIG. 4 is an enlarged sectional view illustrating a display panel of FIG. 3.

FIG. 4 is an enlarged sectional view illustrating the display panel 100 of FIG. 3.

Referring to FIG. 4, the display panel 100 includes the first substrate 110, the second substrate 120 facing the first substrate 110, and a liquid crystal layer LC disposed between the first and second substrates 110 and 120.

The first substrate 110 includes a first base substrate 111 that provides relatively good transmission of light both in the visible band and in the IR band. A plurality of pixel units such as one including PX1 to PX6 is formed on the first base substrate 111. Each of the pixel units PX1 to PX6 includes a thin film transistor Tr and a pixel electrode 115.

The illustrated six pixels PX1 to PX6 arranged in the first direction are shown as an example in FIG. 4. Each of the pixels PX1 to PX6 may have essentially the same structure, and thus one pixel will be described below as an example.

A gate electrode GE1 of the thin film transistor Tr is formed on the first base substrate 111. The gate electrode GE1 is covered by a first gate insulating layer 112.

A semiconductive active layer ACT1 and an ohmic contact layer ACT2 are formed on the first gate insulating layer 112 to face the gate electrode GE1. Subsequently, a source electrode SE1 and a drain electrode DE1 that are spaced apart from each other at a certain interval are disposed over the active layer ACT1. The source electrode SE1 and the drain electrode DE1 are covered by a first passivation layer 113, and an organic insulation layer 114 is further formed on the first passivation layer 113.

A contact hole 114a exposing the drain electrode DE1 is formed in the first passivation layer 113 and the organic insulation layer 114. The pixel electrode 115 is formed on the organic insulation layer 114, and is electrically connected to the drain electrode DE1 through the contact hole 114a. The various materials of the first substrate 110 are selected to transmit with good efficiency (e.g., better than 25%) light in the visible band and light in the IR band at least through predetermined pixel aperture subareas of the display area.

The second substrate 120 includes a second base substrate 121 which also provides relatively good transmission of light both in the visible band and in the IR band, a color filter layer 125 including a plurality of color filters R, G and B that are formed in correspondence with the pixel units PX and a plurality of sensors SN1 and SN2 formed on the second base substrate 121, and a reference or common electrode 127. At least one of the color filters in the color filter layer 125 provides relatively good transmission of light in the IR band.

The plurality of sensors SN1 and SN2 are formed on the second base substrate 121. The sensors SN1 and SN2 are divided into the first-type sensor SN1 (IR sensitive) and the second-type sensor SN2 (sensitive to visible light). The first sensor SN1 includes a first switching transistor SWT1, a first capacitor CS1, and a first sensor transistor IRT. The second sensor SN2 includes a second switching transistor SWT2, a second capacitor CS2, and a second sensor transistor VST.

The first and second sensors SN1 and SN2 share a same basic structure, and thus may be substantially formed through a same fabrication process.

Specifically, a gate electrode GE2 of the first switching transistor SWT1 and a gate electrode GE3 of the second switching transistor SWT2 are formed on the second base substrate 121.

A second gate insulating layer 122 is formed on the gate electrode GE2 of the first switching transistor SWT1 and the gate electrode GE3 of the second switching transistor SWT2. A semiconductive layer SEM1 of the first switching transistor SWT1 and a semiconductive layer SEM2 of the second switching transistor SWT2 are formed on the second gate insulating layer 122.

A first light sensing layer LSE1 of the first sensor transistor IRT and a second light sensing layer LSE2 of the second sensor transistor VST are formed on the second gate insulating layer 122. The first light sensing layer LSE1 may be formed of a silicon germanium composition ($Si_xGe_y$) that is responsive to predetermined wavelengths of the first light (in an infrared range), and the second light sensing layer LSE2 may be formed of an amorphous silicon composition (a-Si) that is responsive to predetermined wavelengths of the second light (in a visible light range).

The second substrate 120 may further include an infrared filter 128 that blocks the second light and transmits the first light. The infrared filter 128 may be disposed between the second base substrate 121 and the second gate insulating layer 122 in correspondence with the first light sensing layer LSE1. In one embodiment, the infrared filter 128 is formed of a silicon germanium composition ($Si_xGe_y$) that absorbs light in the visible range but transmits light in the IR band.

A source electrode SE2 and a drain electrode DE2, which are spaced apart from each other at a certain interval, are formed on the semiconductive layer SEM1 of the first switching transistor SWT1. A source electrode SE3 and a drain electrode DE3, which are spaced apart from each other at a certain interval, are formed on the semiconductive layer SEM2 of the second switching transistor SWT2.

A source electrode SE4 and a drain electrode DE4, which are spaced apart from each other at a certain interval, are formed on the first light sensing layer LSE1 of the first sensor transistor IRT. A source electrode SE5 and a drain electrode DE5, which are spaced apart from each other at a certain interval, are formed on the second light sensing layer LSE2 of the second sensor transistor VST.

Herein, the source electrode SE4 of the first sensor transistor IRT is electrically connected to the drain electrode DE2 of the first switching transistor SWT1, and may also serve as the first electrode of the first capacitor CS1.

Moreover, the source electrode SE5 of the second sensor transistor VST is electrically connected to the drain electrode DE3 of the second switching transistor SWT2, and may serve as the first electrode of the second capacitor CS2.

The source electrode SE2 and drain electrode DE2 of the first switching transistor SWT1, the source electrode SE3 and drain electrode DE3 of the second switching transistor SWT2, the source electrode SE4 and drain electrode DE4 of the first sensor transistor IRT, and the source electrode SE5 and drain electrode DE5 of the second sensor transistor VST are covered by a second passivation layer 123.

A gate electrode TGE1 (hereinafter referred to as a first top gate) of the first sensor transistor IRT and a gate electrode TGE2 (hereinafter referred to as a second top gate) of the second sensor transistor VST are formed on top of the second passivation layer 123 (where the second substrate 120 is inverted when assembled on top of the first substrate 110).

The second electrode of the first capacitor CS1 and the second electrode of the second capacitor CS2 are formed on the second passivation layer 123.

In one embodiment, the first switching transistor SWT1 may further include a supplemental top gate electrode TGE3 that is formed on the second passivation layer 123 and electrically connected to the gate electrode GE2. Also, the second switching transistor SWT2 may further include a supplemental top gate electrode TGE4 that is formed on the second passivation layer 123 and electrically connected to the gate electrode GE3. Thus, the first and second switching transistors, SWT1 and SWT2 may have dual gated structures.

Moreover, as illustrated in FIG. 4, the first top gate TGE1 of the first sensor transistor IRT may be electrically connected to the infrared filter 128 where the latter is doped to be conductive. Specifically, a connection electrode CE may be formed on the infrared filter 128 through the same process as that of the gate electrode GE2 of the first switching transistor SWT1. A second contact hole 123a for exposing the connection electrode CE may be formed in the second gate insulating layer 122 and the second passivation layer 123, and the first top gate TGE1 may be electrically connected to the connection electrode CE through the second contact hole 123a.

The first top gate TGE1 of the first sensor transistor IRT, the second top gate TGE2 of the second sensor transistor VST, the supplemental gate electrode TGE3 of the first switching transistor SWT1, and the supplemental gate electrode TGE4 of the second switching transistor SWT2 may be covered by a second organic insulation layer 124. The color filter layer 125 is formed on the second organic insulation layer 124. The color filter layer 125 may include red, green and blue color filters R, G and B, each of which may be disposed corresponding to one pixel unit.

An overcoating layer 126 is formed on the color filter layer 125. The reference electrode 127 is formed on the overcoating layer 126.

Still referring to FIG. 4, the display panel 100 may further include a first optical film 180 formed under and attached to the first base substrate 111, and a second optical film 190 formed on top of and attached to the second base substrate 121. Each of the first and second optical films 180 and 190 may include a polarization film.

A protective transparent substrate 300 for protecting the display panel 100 against an external impact may be further formed on the second optical film 190.

The first and second optical films 180 and 190 and the protective substrate 300 will be described below in detail with reference to the accompanying drawings.

Figure 5:
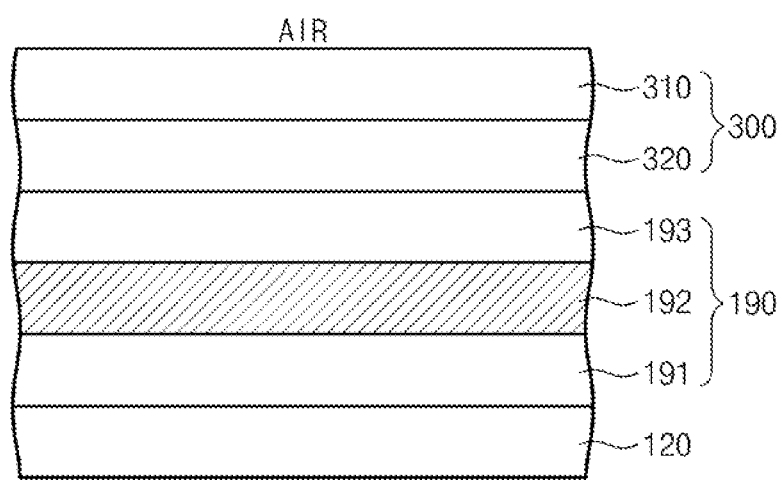
FIG. 5 is a sectional view schematically illustrating a second substrate, a second optical film, and a protective substrate of FIG. 4, according to an embodiment of the present disclosure.

FIG. 5 is a sectional view schematically illustrating with added detail the second substrate, the second optical film and the protective substrate of FIG. 4, according to an embodiment.

Referring to FIG. 5, the second optical film 190 includes a polarization film 192 that substantially transmits light polarized in one direction and substantially absorbs light polarized in a second direction which is substantially orthogonal to the one direction. The polarization film 192, for example, may include poly vinyl alcohol (PVA).

Moreover, the second optical film 190 may include a first protective film 191 disposed between the polarization film 192 and the second substrate 120, and a second protective film 193 that is disposed to face the first protective film 191 with the polarization film 192 disposed therebetween. The first and second protective films 191 and 193 are disposed to face each other with the polarization film 192 therebetween, for example, may include tri acetyl cellulose (TAC).

The protective substrate 300 includes a transparent substrate 310 that is disposed on the second optical film 190 to protect the second optical film 190. The transparent substrate 310 may be formed of a transparent material transmitting incident light, for example, may have a glass substrate or a plastic substrate. The protective substrate 300 may further include a refractive index compensation layer 320 disposed between the transparent substrate 310 and the second optical film 190. The refractive index compensation layer 320 is a layer having a refractive index value ($n_2$) that is between a first refractive index value ($n_1$) of the transparent substrate 310 and a third refractive index value ($n_3$) of the second protective film 193. Thus, when light outputted from the second protective film 193 passes through the transparent substrate 310, the refractive index compensation layer 320 can decrease the rate of light reflected by the interface of the transparent substrate 310 to lower layers of the display device.

Specifically, a reflectivity R of light at an interface between two materials having different refractive indexes is defined as Equation (1) below. Herein, $n_t$ is a refractive index of a material that allows light to be outputted at the interface, and $n_i$ is a refractive index of a material that allows light to be inputted at the interface.

$$R = \left(\frac{n_t - n_i}{n_t + n_i}\right)^2 \quad (1)$$

Referring to Equation (1), it can be seen that as a difference of refractive index between two materials becomes higher, a reflectivity of light at an interface therebetween becomes higher. Conversely, if the refractive indices are better matched to each other (e.g., in specific wavelength ranges), less of the inputted light is reflected at the interface.

Thus, in referring to FIG. 5 and the above Equation (1), it can be seen that when light outputted from the second protective film 193 is inputted to the transparent substrate 310, the rate of light reflected by the transparent substrate 310 can be further reduced in a case where the refractive index compensation layer 320 is disposed between the transparent substrate 310 and the second protective film 193 than a case where an air layer AIR (n is about 1.0) is formed between the transparent substrate 310 and the second protective film 193. For example, the refractive index compensation layer 320 having about a refractive index ($n_2$) of 1.50 may be used between the second protective film 193 and the transparent substrate 310 when the refractive index of the second substrate 120 is about 1.52, the refractive index of each of the first and second protective films 191 and 193 ($n_3$) is about 1.48, the refractive index of the polarization film 192 ($n_4$) is about 1.52 and the refractive index ($n_1$) of the transparent substrate 310 is about 1.52.

A refractive index difference of about 0.52 occurs between the transparent substrate 310 and the air layer AIR (i.e., a medium) on the upper interface side of the transparent substrate 310, and thus light generated by the backlight unit 250 has the highest undesirable reflectivity back to the source when the light is irradiated from the transparent substrate 310 out to the air layer AIR.

Figure 6:
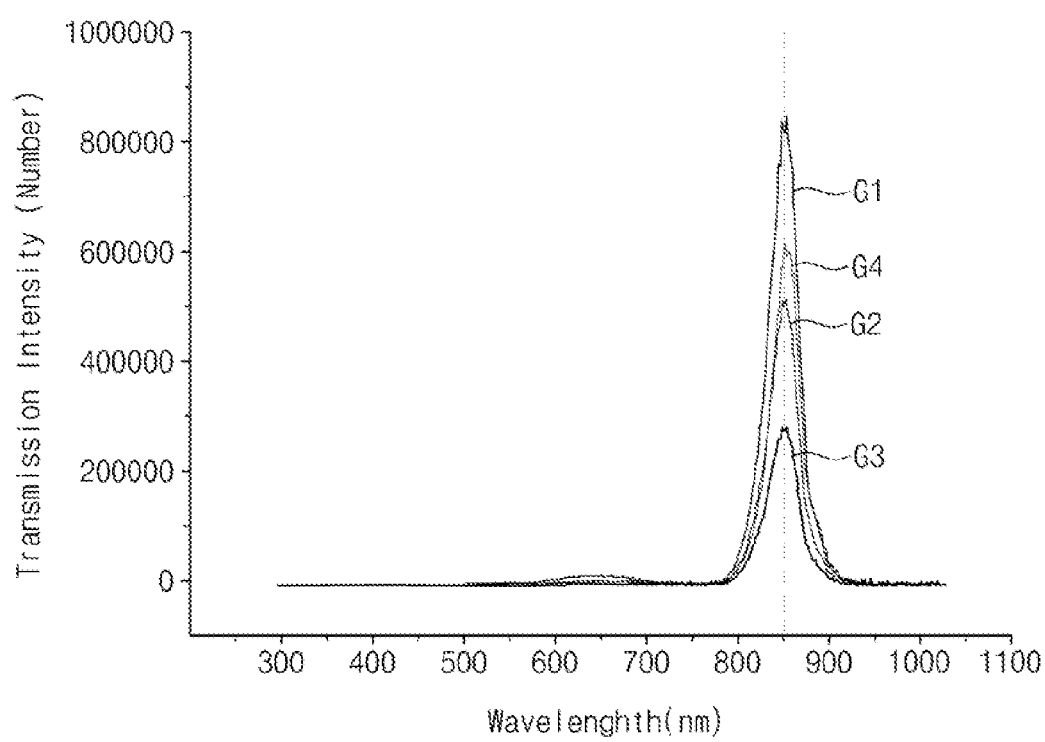
FIG. 6 is a view showing a transmission intensity for a wavelength of light passing through an infrared filter.

FIG. 6 is a view showing a transmission intensity for wavelengths of light passing through various kinds of infrared filters. Specifically, IR light outputted from the backlight unit 250 may be transmitted through the infrared filter 128, and thereafter back reflected IR light may also be transmitted through the infrared filter 128. FIG. 6 shows a transmission intensity for different wavelengths of the transmitted light for different kinds of IR filters (G1-G4). In FIG. 6, a first graph plot G1 shows a transmission intensity for wavelengths when a bandpass filter having a thickness of about 2100 Å is used as the infrared filter 128, a second graph plot G2 shows a transmission intensity for a wavelength when a phosphine (PH3)-doped bandpass filter is used as the infrared filter 128, a third graph G3 shows a transmission intensity for a wavelength when a bandpass filter where a germanium layer and a silicon germanium layer are respectively overlapped to a thickness of about 500 Å is used as the infrared filter 128, and a fourth graph G4 shows a transmission intensity for a wavelength when a bandpass filter having a thickness of about 3000 Å is used as the infrared filter 128.

Still referring to FIG. 6, the infrared filter 128 is a filter having a passband in an infrared range. Therefore, it can be seen that the infrared filter 128 passes light in the infrared range. Although not well seen in FIG. 6, in the first to fourth graph plots G1-G4, an undesirable amount of visible light might pass through the infrared filter 128. In FIG. 6, light in the infrared range denotes light having a wavelength of about 800 nm to about 900 nm, and the visible light denotes light having a wavelength of about 600 nm to about 700 nm. Referring to FIGS. 4 and 6, therefore, it can be seen that when visible light of relatively high intensity is reflected from an interface provided directly above or to the side and above the infrared filter 128, particularly, visible light reflected from an interface between the transparent substrate 310 and the ambient air layer AIR, such high intensity reflected light may be inputted at sufficient intensity to the first sensor transistor IRT and detected thereby (undesirably) even when the infrared filter 128 is used on the each sensor SN1 that is configured for primarily sensing first light having a wavelength in the infrared range, specifically, on the each first sensor transistor IRT. In such a case the back reflected visible light might be wrongly interpreted as being back reflected IR light and that interpretation may lead to incorrect determination by data processing resources of the display device as meaning that an intentional screen touch has occurred.

Figure 7:
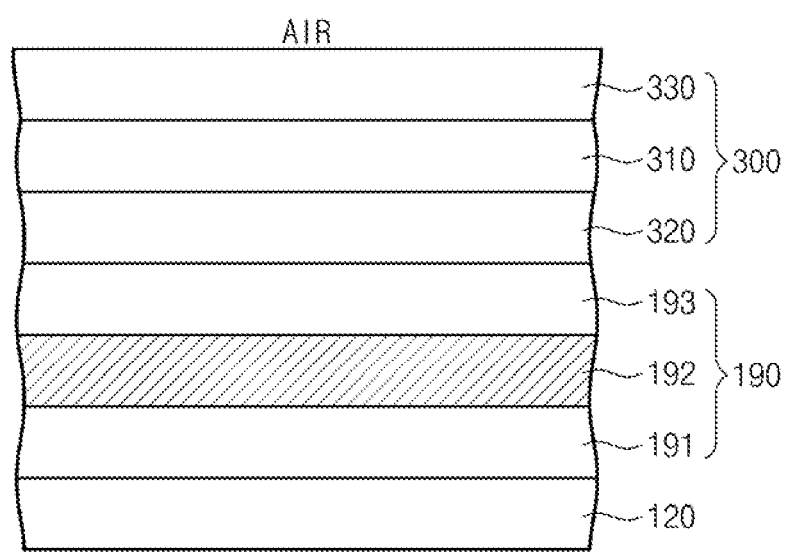
FIG. 7 is a sectional view schematically illustrating a second substrate, a optical film, and a transparent substrate of FIG. 4, according to another embodiment of the present disclosure.

In accordance with the present disclosure, one or more steps may be taken to reduce the likelihood that high intensity light in visible light band will be back reflected into the first-type sensor transistors IRT. (Back reflection of light in visible light band to the second-type sensor transistors VST may also be a problem and the techniques disclosed here may be used to also reduce back reflection of light in visible light band to the second-type sensor transistors VST.) FIG. 7 is a sectional view schematically illustrating the second substrate in accordance with one embodiment of the present disclosure which includes the optical film and the transparent substrate of FIG. 4. In description of the elements of FIG. 7, the same elements as those of FIG. 5 are indicated by like reference numerals, and their detailed description will therefore not be provided again. Just briefly, layer 310 may have a respective first refractive index ($n_1$), layer 320 may have a respective second refractive index ($n_2$), layer 193 may have a respective third refractive index ($n_3$), and layer 192 may have a respective fourth refractive index ($n_4$).

Referring to FIG. 7, the protective substrate 300 of this embodiment further includes a one-quarter wave plate 330 that is disposed to face substantially parallel with the polarization film 192 and with the transparent substrate 310 where the transparent substrate 310 is interposed between the wave plate 330 and the polarization film 192. (Other variations are also within contemplation of the present disclosure where for example, although not shown; the wave plate 330 is interposed between the transparent substrate 310 and the polarization film 192.) The wave plate 330 changes a polarization direction of incident light which has passed through the wave plate 330 just once by about 45 degrees. The wave plate 330 therefore changes a polarization direction of light, which has passed through the wave plate 330 twice (which double passage can be due to back reflection), by about 90 degrees. Specifically, the wave plate 330 causes a total change of phase of twice-passed through light by 90 degrees where such twice-passed through light can be in the form of light outputted through the transparent substrate 310 toward the ambient AIR and reflected by the interface between the wave plate 330 and the air layer AIR for thereby being again inputted to the transparent substrate 310. In other words, the wave plate 330 is an optical element that changes a phase between first light polarized in a first direction and second light polarized in a second direction substantially vertical to the first direction by 90 degrees, for example, corresponding to ¼ wavelength.

In detail, for example, the wave plate 330 changes a phase by 45 degrees when light outputted from the transparent substrate 310 and polarized in the first direction passes through the wave plate 330, further changes a phase by another 45 degrees when light is reflected by the air layer AIR and again passes through the quarter wave plate 330, and thus change light, polarized in the first direction, to light polarized in the second direction. In light reflected between the wave plate 330 and the air layer AIR, therefore, the axis of linearly-polarized light is changed by a total 90 degrees (45+45=90), and thus the 90 degree rotated wavelength of visible light cannot substantially pass through the polarization film 192 because the latter film substantially absorbs or otherwise blocks such 90 degree rotated, polarized light. The wave plate 300, for example, may be a quarter-wave plate. Also, the wave plate 330 may change a phase of light having a wavelength in the range of about 600 nm to about 750 nm by a total of 90 degrees, for example, ¼ wavelength in each pass through. Therefore, the wave plate 330 may be designed to act as a ¼ wavelength plate for a center wavelength in a visible light spectrum of from 600 nm to 750 nm. Of course the optimally blocked visible light wavelength due to the combination of the wave plate 330 and polarizer 192 may be selected to be substantially the same as the visible light wavelength that an IRT transistor or a VST transistor is most sensitive to and the latter wavelength may not necessarily be a center wavelength in the visible light spectrum of from 600 nm to 750 nm.

Figure 8A:
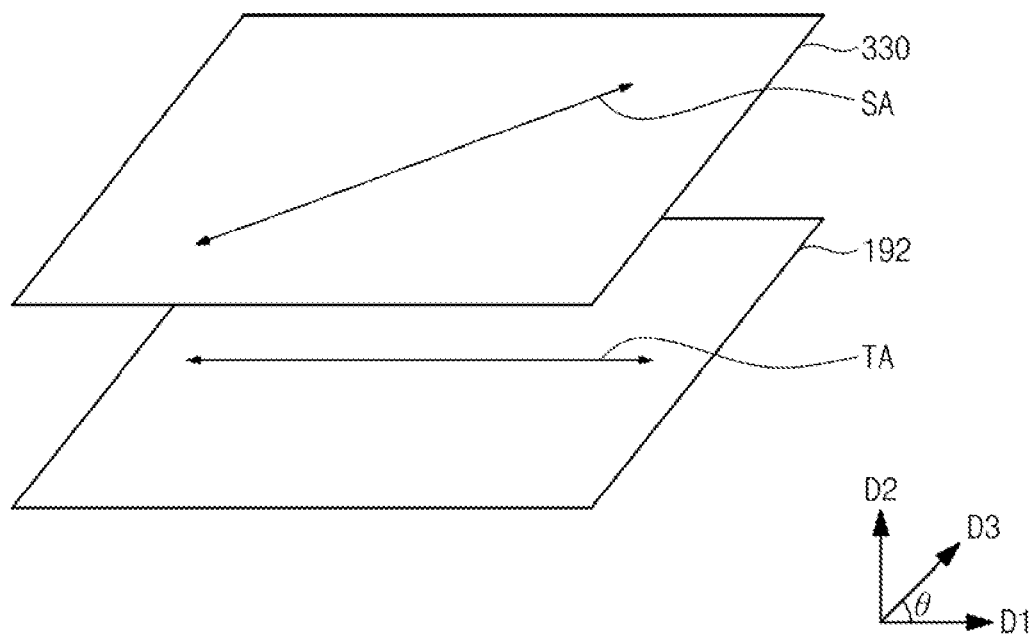
FIG. 8A is a view for describing a relationship between a slow axis of a wave plate and a transmission axis of a polarization film in FIG. 7.
Figure 8B:
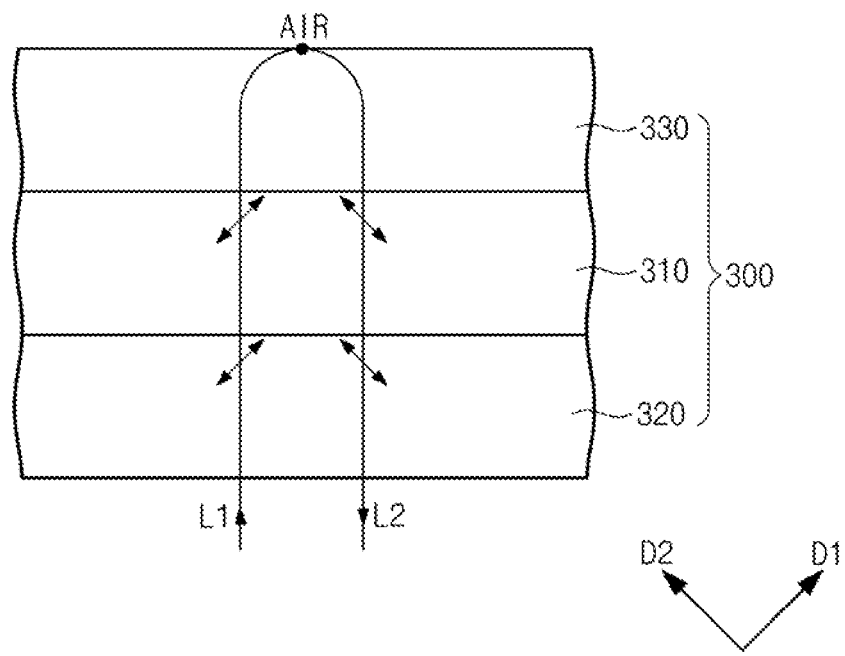
FIG. 8B is a view for describing an operation where a phase of light is changed in the wave plate of FIG. 7.

FIG. 8A is a view for describing a position relationship between a slow axis of the wave plate and a transmission axis of the polarization film in FIG. 7. FIG. 8B is a view for describing an operation where a phase of light is changed in the wave plate of FIG. 7.

Referring to FIG. 8A, a transmission axis TA of the polarization axis 192 may be formed in parallel with a first direction D1, and a slow axis SA of the wave plate 330 may be formed in parallel with a third direction D3 that is angled by an angle (θ) with respect to the first direction D1. The angle (θ) may be about 45 degrees, but may be alternatively formed within a range from about 20 degrees to about 70 degrees according to different embodiments that are still in accordance with the present disclosure.

Specifically, a phase change (Γ) in the wave plate 330 is defined as Equation (2) below. In Equation (2), n is a absolute value of a difference between a refractive index in the first direction D1 and a refractive index in the second direction D2, L is a thickness of the wave plate 330, and λ is a wavelength of incident light. Referring to Equation (2), the angle (θ) may be appropriately controlled to change a polarization direction of light inputted to the wave plate 330 by a total of 90 degrees.

Referring to FIG. 8B, first visible light L1 of a predetermined wavelength that is outputted from the polarization film 192 is incident on the wave plate 330 as light polarized in the first direction D1. Specifically, the first visible light L1 may have a wavelength in the range of about 600 nm to about 750 nm. The first visible light L1 incident on the wave plate 330 is changed by 90 degrees in phase until reaching an interface between the wave plate 330 and the air layer AIR on the wave plate 330. That is, the first visible light L1 is changed from a linearly-polarized state to a circularly-polarized state.

In the interface between the wave plate 330 and the air layer AIR, a portion of the first visible light L1 is inputted to the air layer AIR, and another portion of the first visible light L1 is reflected from the interface between the wave plate 330 and the air layer AIR and again passes through the wave plate 330 as second visible light L2. The second visible light L2 is further changed by another 90 degrees in phase when again passing through the wave plate 330. That is, the circularly-polarized second visible light L2 is linearly polarized in the second direction D2. Therefore, the second visible light L2 irradiated from the wave plate 330 to the transparent substrate 310 is linearly polarized in the second direction D2 and changed by a total of 90 degrees in linearly-polarized direction compared to the first visible light L1 outputted from the polarization film 192. In other words, a polarization direction of the second visible light L2 reflected from the interface between the wave plate 330 and the air layer AIR is the second direction D2, a polarization direction of the first visible light L1 outputted from the polarization film 192 is the first direction D1, and thus the second visible light L2 is absorbed by the polarization film 192 without passing through the polarization film 192 having the transmission axis TA in the first direction D1. As a result, the wave plate 330 changes a phase of light having a wavelength in the band of about 600 nm to about 700 nm and thus prevents that visible band light from being inputted to the first sensor transistor IRT, thereby preventing the performance of the first sensor SN1 (and/or the second type sensor SN2) from being corrupted by back-reflected light of the visible band.

Figure 9:
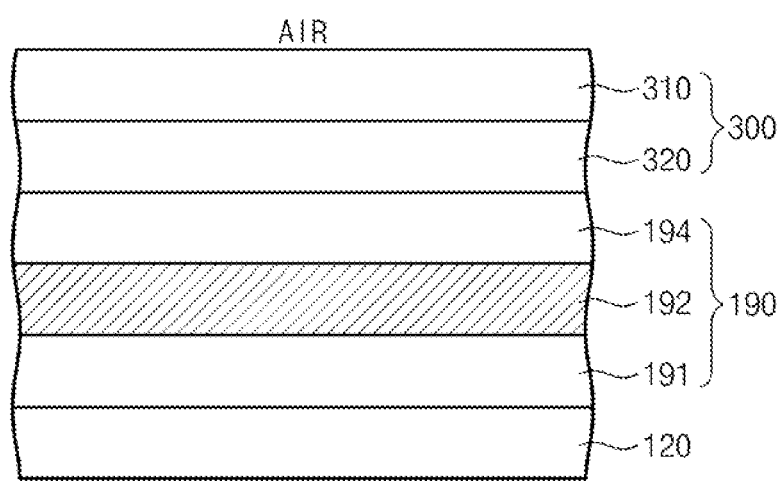
FIG. 9 is a sectional view schematically illustrating a second substrate, a second optical film, and a protective substrate of FIG. 4, according to still another embodiment of the present disclosure.

FIG. 9 is a sectional view schematically illustrating the second substrate, the second optical film and the protective substrate of FIG. 4, according to another embodiment of the inventive concept. In description of the elements of FIG. 9, the same elements as those of FIG. 5 are indicated by like reference numerals, and their detailed description will not be provided.

Referring to FIG. 9, the second optical film 190 includes a polarization film 192, a protective film 191 formed between the polarization film 192 and the second substrate 120, a wave plate 194 that is disposed to face the protective film 191 with the polarization film 192 therebetween. Optical characteristic of the wave plate 194 in FIG. 9 is the substantially same as that of the wave plate 330 in FIG. 7. The wave plate 194 changes a polarization direction of incident light and supports the polarization film 192. Specifically, when light outputted through the polarization film 192 is reflected by the interface between the transparent substrate 310 and the air layer AIR and is again inputted to the polarization film 192, the wave plate 194 changes a phase of the light by 180 degrees.

Figure 10:
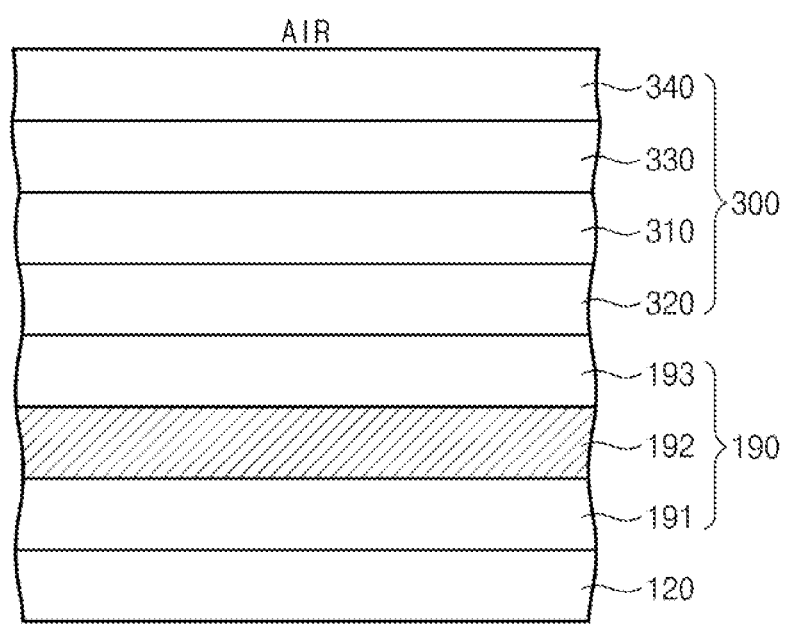
FIG. 10 is a sectional view schematically illustrating the second substrate, a second optical film, and a protective substrate of FIG. 4, according to still another embodiment of the present disclosure.

FIG. 10 is a sectional view schematically illustrating the second substrate, the second optical film and the protective substrate of FIG. 4, according to another embodiment of the inventive concept. In description of the elements of FIG. 10, the same elements as those of FIG. 7 are indicated by like reference numerals, and their detailed description will not be provided.

$$\Gamma = 2\pi \times \Delta n \times L/n \qquad (2)$$

Referring to FIG. 10, the protective substrate 300 further includes a low refractive index film 340 that is disposed to face the transparent substrate 310 with the wave plate 330 therebetween. The low refractive index film 340 has a refractive index ($n_O$) greater than 1 or less than about 1.45, and thus decreases reflection of light due to a large refractive index difference between that (n0.5) of the wave plate 330 and the lower refractive index of the ambient air layer AIR at the interface between the wave plate 330 and the air layer AIR.

In FIG. 10, the low refractive index film 340 is illustrated as disposed on top of the wave plate 330, but it may instead be disposed on the transparent substrate 310 if the wave plate 330 is not present according to an embodiment aspect.

According to the above-described provisions, undesired back reflections in a display device may be reduced by use of one or both index difference reduction quarter wave rotation, where in the latter; the wave plate changes a polarization direction of light transmitted through the polarization film and thus prevents the light from again being incident on the display panel below because the polarization film 192 blocks the twice rotated light. Accordingly, the sensing abilities of the IR optical sensors can be prevented from being corrupted by back reflected visible light.

The above-disclosed subject matter is to be considered illustrative and not restrictive, of the true spirit and scope of the inventive concepts taught herein.

What is claimed is:

1. A display device comprising:
    a display panel having spaced apart first and second substrates facing each other, with a plurality of image displaying pixels provided on one of the substrates and configured for displaying a potentially changing image in a visible light band;
    a plurality of optical sensors provided in the display panel and configured to sense light in one or more predetermined light bands;
    a polarization film provided in the display device and configured to substantially transmit light polarized in a first direction and to substantially absorb or otherwise block light polarized in a second direction, where the second direction is substantially perpendicular to the first direction; and
    a polarization-changing wave plate disposed in the display device above the polarization film and oriented to face the polarization film such that first polarized light that has once passed through the polarization film and then next passes a first time through the polarization-changing wave plate has its respective polarization changed by the polarization-changing wave plate to thus become second polarized light and such that if the second polarized light is reflected to pass a second time through the polarization-changing wave plate, the second polarized light has its respective polarization changed by the polarization-changing wave plate to thus become third polarized light that is polarized in a polarization direction that is rotated by about 90 degrees relative to the first direction so that the polarization film therefore substantially absorbs or otherwise blocks the reflected third polarized light from passing through the polarization film.

2. The display device of claim 1, wherein the polarization-changing wave plate converts linearly polarized light passing therethrough into circularly polarized light and converts circularly polarized light passing therethrough into linearly polarized light.

3. The display device of claim 1, further comprising a transparent substrate disposed above and facing the display panel to protect the display panel, where the polarization film is interposed between the transparent substrate and the display panel.

4. The display device of claim 3, wherein the wave plate is disposed above and facing the polarization film with the transparent substrate being interposed between the wave plate and the polarization film.

5. The display device of claim 4,
    wherein the transparent substrate has a respective first refractive index (n1) greater than a refractive index of ambient air, the wave plate has a respective second refractive index (n0.5) also greater than the refractive index of ambient air but less than the first refractive index (n1) of the transparent substrate, and
    wherein the display device further comprises a low refractive index film having a third refractive index (n0) that is of a value intermediate between the second refractive index (n0.5) and the refractive index of ambient air where the low refractive index film is disposed between the wave plate and ambient air.

6. The display device of claim 4, wherein the wave plate is a quarter-wave plate with respect to a predetermined wavelength in the visible light band.

7. The display device of claim 6, wherein the quarter-wave plate generates a phase difference of ¼ wavelength with respect to light having a wavelength in a range of about 600 nm to about 750 nm.

8. The display device of claim 4, wherein an angle between a slow axis of the wave plate and the first direction is about 20 degrees to about 70 degrees.

9. The display device of claim 8, wherein the angle between the slow axis of the wave plate and the first direction is about 45 degrees.

10. The display device of claim 4,
    wherein the transparent substrate has a respective first refractive index (n1) greater than a refractive index of ambient air, the wave plate has a respective second refractive index (n0.5) also greater than the refractive index of ambient air but less than the first refractive index (n1) of the transparent substrate, the polarization film has a fourth refractive index (n4) different from the first refractive index (n1); and
    wherein the display device further comprises a refractive index compensation layer disposed between the transparent substrate and the polarization film, the refractive index compensation layer having a refractive index (n2) of a value between the refractive index (n1) of the transparent substrate and the refractive index (n4) of the polarization film.

11. The display device of claim 4, further comprising a plurality of light sources provided adjacently to the first substrate to supply light to the display panel,
    wherein the polarization film is provided on the second substrate.

12. The display device of claim 3, wherein the wave plate is disposed between the polarization film and the transparent substrate.

13. The display device of claim 12, further comprising a low refractive index film disposed to face the polarization film with the wave plate therebetween, and having a refractive index between a refractive index of the wave plate and a refractive index of air.

14. The display device of claim 12, wherein the wave plate is a quarter-wave plate with respect to a predetermined wavelength in the visible light band.

15. The display device of claim 14, wherein the quarter-wave plate generates a phase difference of ¼ wavelength with respect to light having a wavelength in a range of about 600 nm to about 750 nm.

16. The display device of claim 12, wherein an angle between a slow axis of the wave plate and the first direction is about 20 degrees to about 70 degrees.

17. The display device of claim 16, wherein the angle between the slow axis of the wave plate and the first direction is about 45 degrees.

18. The display device of claim 12, further comprising a refractive index compensation layer disposed between the transparent substrate and the wave plate, and having a refractive index between a refractive index of the transparent substrate and a refractive index of the wave plate.

19. The display device of claim 12, further comprising a plurality of light sources provided adjacently to the first substrate to supply light to the display panel,
   wherein the polarization film is provided on the second substrate.

20. The display device of claim 1, wherein the wave plate changes incident linearly polarized light to circularly polarized light.

\* \* \* \* \*